United States Patent [19]

Jackson

[11] Patent Number: 5,291,239
[45] Date of Patent: Mar. 1, 1994

[54] SYSTEM AND METHOD FOR LEVELING SEMICONDUCTOR WAFERS

[75] Inventor: Ricky A. Jackson, Garland, Tex.

[73] Assignee: Texas Instruments Incorporated, Dallas, Tex.

[21] Appl. No.: 954,516

[22] Filed: Sep. 30, 1992

[51] Int. Cl.[5] ............................................. G03B 27/42
[52] U.S. Cl. .................................................... 355/53
[58] Field of Search .................... 355/53; 356/141, 152

[56] References Cited

U.S. PATENT DOCUMENTS

| | | | |
|---|---|---|---|
| 4,704,020 | 11/1987 | Murakami et al. | 353/122 |
| 4,770,531 | 9/1988 | Tanaka et al. | 356/358 |
| 4,845,530 | 7/1989 | Matsukawa | 355/53 |
| 4,862,245 | 8/1989 | Pashby et al. | 357/70 |
| 4,982,226 | 1/1991 | Takahashi | 355/53 |
| 4,999,669 | 3/1991 | Sakamoto et al. | 355/53 |
| 5,101,226 | 3/1992 | Beaulieu et al. | 355/53 |

OTHER PUBLICATIONS

Glen Zorpette, "Rethinking X-ray Lithography", *IEEE*, Jun. 1992, pp. 33-36.

Alec Broers, "Choices for Tomorrow's Chips", *New Scientist*, Apr. 18, 1992, pp. 23-27.

Wm. C. Ward, "Volume Production of Unique Plastic Surface-Mount Modules ffor the IBM 80-NS 1-Mbit Dram Chip by Area Wire Bond Techniques," 0569-5503/88/0000-0552, *IEEE*, pp. 552-557.

*Primary Examiner*—Richard A. Wintercorn
*Attorney, Agent, or Firm*—Robby T. Holland; James C. Kesterson; Richard L. Donaldson

[57] ABSTRACT

A leveling system (10 and 50) with adjustable light beams (38, 53, 55, 59 and 61) is provided for photoli7 thography processes used in manufacturing integrated circuits. The beams (38, 53, 55, 59 and 61) used to assist with positioning wafer (12) relative to the projection camera lens (90) of the step and repeat camera (92) are adjusted for the exposure field (22 and 70) and the desired chip size. For large beam systems (10), the beam width is modified to match the exposure field (22) di7 mensions which correspond to the desired chip dimensions. For multiple beam systems (50), the geometric relationship of the beams (53, 55, 57, 59 and 61) relative to each other and the desired exposure field (70) are adjusted to provide optimum leveling of the wafer (12) with respect to the projection camera lens (90).

20 Claims, 2 Drawing Sheets

SYSTEM AND METHOD FOR LEVELING SEMICONDUCTOR WAFERS

RELATED APPLICATION

This application is related to co-pending U.S. Pat. application Ser. No. 954,515 filed on Sep. 30, 1992.

TECHNICAL FIELD OF THE INVENTION

This invention relates to integrated circuits, and more particularly relates to leveling a semiconductor wafer during the photolithography process.

BACKGROUND OF THE INVENTION

Various techniques have previously been used to manufacture integrated circuits on semiconductor wafers. Optical projection lithography using ultra-violet light is one of the more common techniques. Projection lithography techniques use a mask which is several times larger than the integrated circuit which the process will create. The pattern or circuit is projected from some distance onto a photoresist on a semiconductor wafer.

A step-and-repeat camera system (sometimes referred to as a "stepper") operates by projecting an image containing a portion of an integrated circuit onto one or more chips in a reticle or exposure field on a semiconductor wafer. The stepper then moves to the next exposure site on the wafer and repeats the process. As the line width for integrated circuits on semiconductor devices becomes smaller and smaller, step-and-repeat camera systems with higher aperture numbers or larger lens are used to improve the performance of the lithography process.

As higher number aperture lenses are used to project the integrated circuit onto the wafer, improved resolution is required to meet shrinking line width needs. Increasing the numerical aperture to improve resolution has a negative effect by reducing the depth of focus of the system. At the same time, integrated circuits on semiconductor devices are becoming more complex requiring several more process steps (more topography), which increases the difficulty of maintaining focus across the entire exposure field on a wafer. These requirements increase the demand on the lithography process for greater depth of focus to improve production. Several techniques are being applied to improve depth of focus, such as planarization, the use of smaller wave lengths of light for exposure, and chip leveling on the exposure tools.

A common practice used to compensate for wafer taper and bow, is tilting the wafer before each exposure to match the wafer plane in the exposure field to the step and repeat camera lens plane. This tilting is accomplished by measuring where the surface of the wafer is located, and then tilting the wafer to obtain an optimized plane to lens alignment. Current state-of-the-art steppers often have an alignment system with a fixed beam size which covers a large portion of the exposure field. The beam is reflected from the selected exposure field onto a four-quadrant detector to determine optimum tilting of the wafer. An alternative alignment system used by other steppers is to project multiple (5 to 20) small focus beams which locate at specific distances from each other on the exposure fields. For example, the four corners and the center of a chip might be a typical multiple beam pattern. Based on information from the beam detectors, the wafer is tilted and then exposed.

While prior leveling systems have worked satisfactorily in the past, the patterns for complex integrated circuits are becoming smaller. At the same time, there is increased variation in the size of semiconductor devices which are placed on a wafer. This results in the leveling beam sometimes being larger than the actual exposure field or the multiple beam system projecting onto chips outside the desired exposure field. When a fixed size leveling beam collects data from areas larger than the exposure field, inclination errors may occur between the plane of the exposure field and the plane of the stepper camera lens. This problem is most pronounced around the edge of a wafer. Steppers with multiple leveling beams distributed over the exposure field will have leveling errors if one or more beams fall outside the desired exposure field.

A need has thus arisen for improved leveling of the wafer and the exposure field on the wafer prior to initiating the lithography process.

SUMMARY OF THE INVENTION

In accordance with the present invention, disadvantages and problems associated with previous semiconductor wafer leveling systems have been substantially reduced or eliminated. The present invention allows the user to match the size of the leveling beam with the size of the desired exposure field or to position multiple leveling beams to match the desired size of the exposure field for each integrated circuit design.

The present invention allows customization of light beams used in a semiconductor wafer leveling system to match the integrated circuit dimensions with the chip size on the wafer. With proper adjustment of the light beam the layout of the integrated circuit can be produced on the wafer without leveling errors. For stepper systems with large, fixed diameter beam leveling systems, masking blades are used with a lens to match the leveling beam dimensions with the desired exposure field and chip size. For leveling systems using multiple small diameter detector beams, each beam is adjusted to allow accurate movement of the beams with respect to each other and with respect to the desired exposure field and chip size.

The present invention has significant technical advantages in that it reduces leveling errors between the desired exposure field on a semiconductor wafer and the plane of the lens in a step and repeat camera system used to project an integrated circuit onto the exposure field. A further technical advantage is that detector beams used to provide information for leveling the exposure field on a wafer may be adjusted to accommodate integrated circuits with different dimensions.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION OF THE INVENTION

The preferred embodiments of the present invention and its advantages are best understood by referring to FIGS. 1 through 5 of the drawings, like numerals being used for like and corresponding parts of the various drawings.

Step and repeat camera systems (hereinafter referred to as steppers) are used to fabricate integrated circuits on semiconductor wafers using photolithography techniques. Projection lens 90, leveling stage 14, and leveling system 10 comprise only a small portion of stepper 92.

Figure 1:
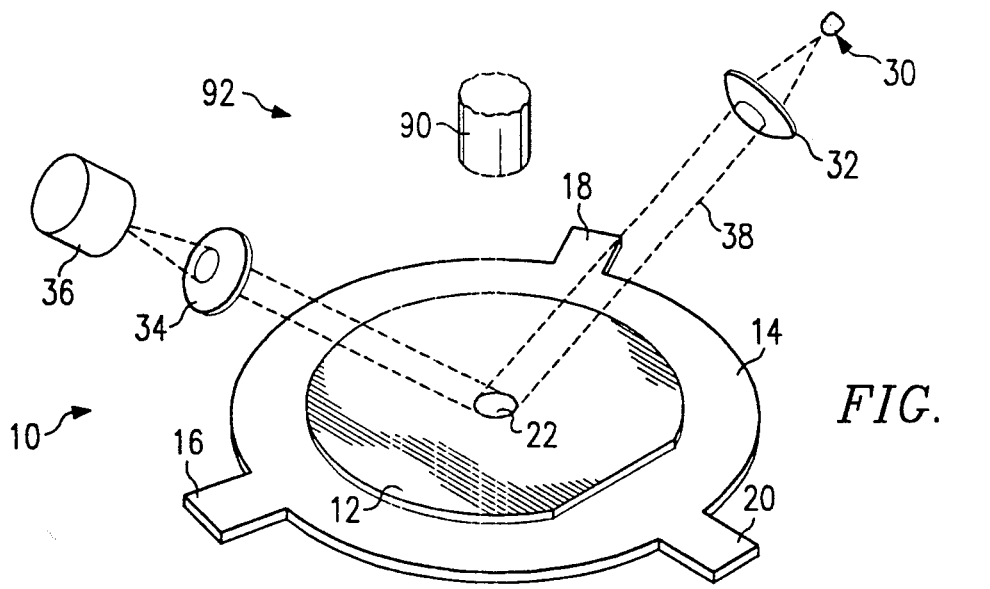
FIG. 1 is a schematic drawing showing portions of a leveling system for use in fabricating integrated circuits on semiconductor wafers.

Leveling system 10 shown in FIG. 1 is used to assist stepper 92 in positioning wafer 12 relative to the projection lens 90 of stepper 92. Wafer 12, preferably a thin slice from a single crystal of semiconductor material such as silicon, is placed on alignment or leveling stage 14 as part of the photolithography process. Tab 16 on leveling stage 14 is fixed relative to the other components of stepper 92 including leveling system 10. Tabs 18 and 20 on leveling stage 14 are preferably attached to drive motors (not shown) which can tilt leveling stage 14 relative to fixed tab 16. In most stepper systems, the projection camera lens 90 remains in a fixed position and leveling stage 14 is moved to position wafer 12 relative to projection lens 90.

The present invention is directed towards aligning or leveling the plane of exposure field 22 on wafer 12 with the plane projection camera lens 90. Alignment or leveling stage 14 may also be used to position wafer 12 relative to projection lens 90 to compensate for other alignment variables such as movement in the X and Y axis and rotation of wafer 12 relative to projection lens 90. Stepper 92 will include additional alignment systems (not shown) in addition to leveling system 10 to move wafer 12 as desired relative to projection lens 90.

The photolithography process is typically used to fabricate a plurality of integrated circuits on wafer 12. Each integrated circuit is built in a series of layers on only a small portion of wafer 12. These small portions or sections of wafer 12 are frequently referred to as chips. The integrated circuit or portions of the integrated, which will be etched or fabricated on each chip, are exposed through projection lens 90 onto exposure field 22. Prior to exposing the integrated circuit to exposure field 22, the position of exposure field 22 relative to the projection lens 90 must be clearly identified. Leveling system 10 and leveling stage 14 are used to adjust the inclination or plane of wafer 12 at exposure field 22 with the plane of projection camera lens 90. This process is frequently referred to as "leveling" wafer 12.

Leveling system 10 includes a wide beam light source 30 such as an LED crystal which projects light through a lens 32 onto the desired exposure field 22. Exposure field 22 corresponds to one or more chips which will be fabricated on this portion of wafer 12. Light beam 38 from source 30 is reflected from exposure field 22 through detector lens 34 onto position detector 36. Light source 30 and lens 32 as shown in FIG. 1 will produce a fixed sized beam 38.

Frequently, different sizes of chips or exposure fields may be desired during the fabrication of integrated circuits on wafer 12. As integrated circuits have become more complex, the dimensions of the exposure field and the resulting chips are also subject to significant changes. Therefore, stepper 92 will frequently be used to manufacture integrated circuit on wafer 12 which have significant variations in chip dimensions. If the dimensions of beam 38 are not adjusted to match the dimensions of the desired exposure field and chip size being fabricated by stepper 92, the plane of exposure field 22 will not be properly leveled with respect to the plane of projection camera lens 90.

Figure 2:
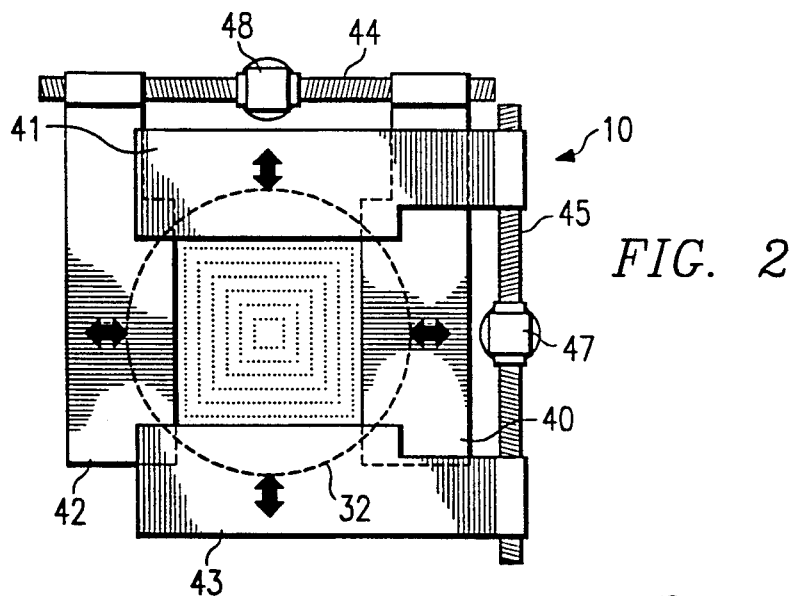
FIG. 2 is a schematic drawing showing a lens incorporating the present invention for use with the leveling system of FIG. 1.

As best shown in FIG. 2, a plurality of masking blades 40, 41, 42 and 43 are provided to adjust the size of light beam 38 which is projected through lens 32 from light source 30. Various combinations of masking blades could be used with the present invention. Preferably, blades 40 and 42 are attached to lead screw 44 such that rotation of lead screw 44 in one direction will cause blades 40 and 42 to move towards each other and close off lens 32. Rotation of lead screw 44 in the opposite direction, will cause blades 40 and 42 to move away from each other, allowing a larger beam of light to pass through lens 32. In the same manner, masking blades 41 and 43 are preferably attached to lead screw 45. Rotation of lead screw 45 in one direction will cause blades 41 and 43 to move towards each other, and block light from passing through lens 32. Rotation of lead screw 45 in the opposite direction, will cause blades 41 and 43 to move away from each other, allowing a larger beam of light to pass through lens 32. Thus, blades 41, 42, 43 and 44 cooperate with each other to provide means for adjusting the dimensions of light beam 38 to correspond with the dimensions of the specific exposure field and chip size which is being fabricated on wafer 12. By adjusting the dimensions of light beam 38, the ability of leveling system 10 to ensure correct alignment or leveling of the exposure field plane with the plane of the projection lens 90 is substantially enhanced.

Figure 3:
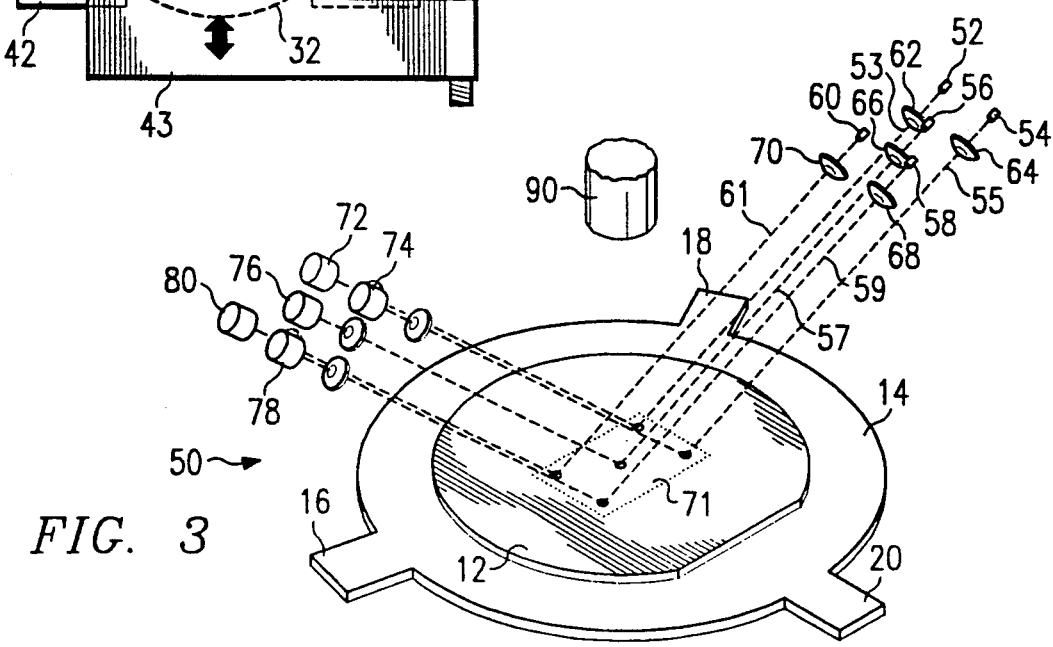
FIG. 3 is a schematic drawing showing portions of an alternative leveling system for use in fabricating integrated circuits on semiconductor wafers.

An alternative leveling system 50 is shown in FIG. 3. In leveling system 50, light sources 52, 54, 56, 58 and 60 are used to project relatively small diameter light beams 53, 55, 57, 59 and 61 through lenses 62, 64, 66, 68 and 70 respectively onto exposure field 71. Light sources 52 through 58 are positioned to project beams 53 through 59 onto the center and four corners of exposure field 71. Each light source 52 through 60 has a corresponding detector 72 through 80 which determines the location of the respective light beam within exposure field 71 on wafer 12.

For different integrated circuits, a different size exposure field and different size chip are required. If light beams 53, 55, 57, 59 and 61 are not adjusted, leveling system 50 will not properly align the plane of the desired exposure field with the plane of projection camera lens 90. Therefore, light beams 53, 55, 57, 59 and 61 must be adjusted to ensure that they fall within the desired exposure field. Light beam 57 will preferably remain in the center of each exposure field without regard to the change in the dimensions of the chip.

Figure 4:
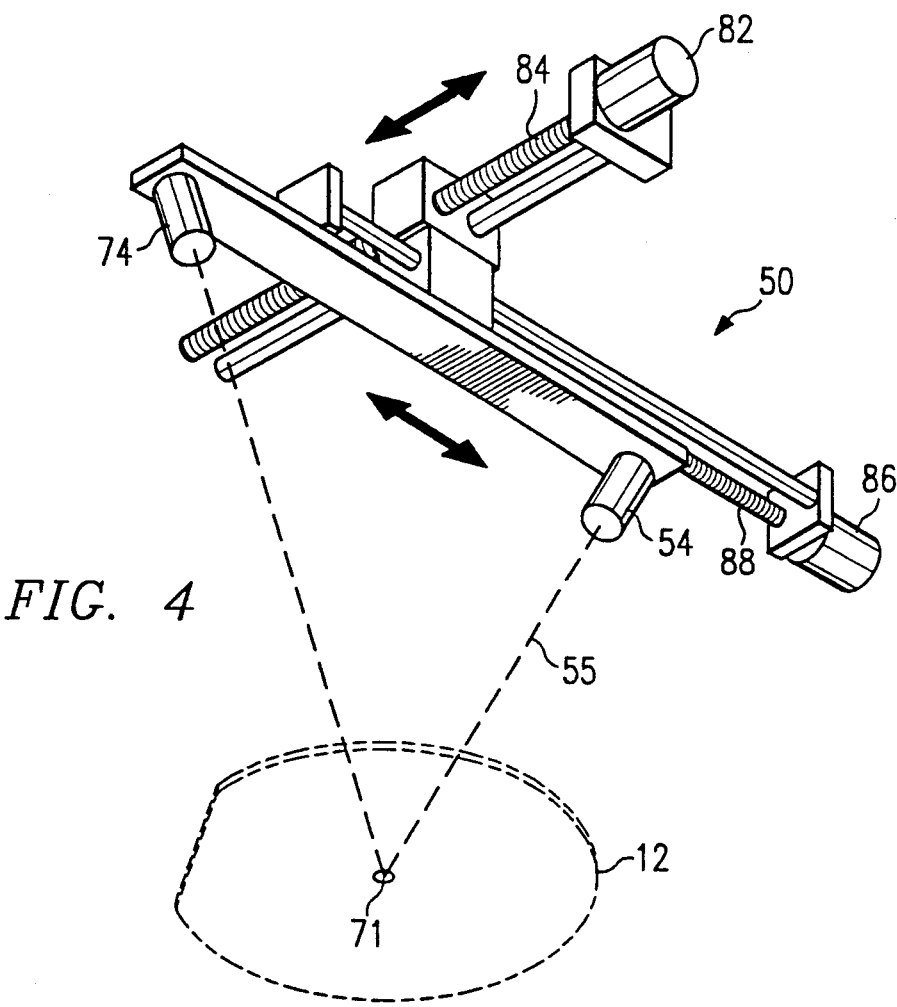
FIG. 4 is a schematic drawing with portions broken away showing a light source and its corresponding detector incorporating the present invention for use with the leveling system of FIG. 3.

In leveling system 50, each light source has a corresponding detector which comprise a set or pair such as light source 54 and detector 74. As shown in FIGURE 4, X axis motor 82 and shafts 84 are preferably attached to light source 54 and its corresponding detector 74 to allow movement of light source 54 and detector 74 in the x direction, relative to wafer 12. In the same manner, Y axis motor 86 and shafts 88 are attached to light source 54 and detector 74 to allow movement in the y direction relative to wafer 12. Although is not shown in FIG. 4, each pair of light source and its corresponding detector would be attached to an X axis motor and a Y axis motor. X axis motors 82 and Y axis motors 86, along with their respective shafts 84 and 88, cooperate to provide means for moving the location of light beam 55 relative to exposure field 71. In the same manner, light beams 53, 59 and 61 may also be moved relative to exposure field 71.

Figure 5:
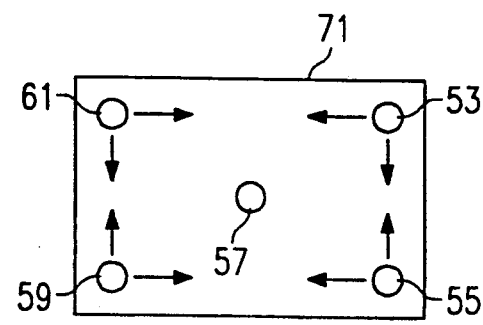
FIG. 5 is a schematic drawing showing movement in accordance with the present invention of multiple light beams used by the leveling system of FIG. 3.

As shown in FIG. 5, beam 57 will remain at the center of each exposure field. The point which beams 53, 55, 59 and 61 contact exposure field 70 may be adjusted in the x and Y axis. This movement allows leveling system 50 to optimize the alignment of the plane of exposure field 71 with the plane of projection camera lens 90.

The previous written description has described the invention with respect to optical lithography using ultraviolet light. Those skilled in the art will readily appreciate that the present invention may be used with other lithographic technologies such as x-ray or electron beam lithography. The invention has also been described with respect to projection lithography techniques. Those skilled in the art will readily note that the improved alignment system disclosed by this invention may also be used in proximity lithography. Both proximity and projection lithography systems will benefit from incorporating the improved alignment techniques resulting from this invention.

Although the present invention and its advantages have been described in detail, it should be understood that various changes, substitutions and alterations can be made therein without departing from the spirit and scope of the invention as defined by the appended claims.

What is claimed is:

1. A system for leveling a semiconductor wafer during fabrication of integrated circuits on the wafer using photolithography techniques comprising:
    a light source for projecting a beam of light onto an exposure field on the wafer;
    a detector to receive the beam reflected from the exposure field and determine the location of the exposure field relative to a first lens; and
    means for adjusting the light beam for the desired exposure field.

2. The system for leveling a semiconductor wafer as defined in claim 1 further comprising:
    a second lens to direct the light beam from the source to the exposure field; and
    means for adjusting the size of the light beam to match the geometry of the desired exposure field.

3. The system for leveling a semiconductor wafer as defined in claim 2 further comprising:
    a plurality of movable blades adjacent to the second lens; and
    lead screws attached to the blades whereby movement of the lead screws will cause the blades to open or close with respect to the second lens.

4. The system for leveling a semiconductor wafer as defined in claim 2 further comprising:
    a pair of blades attached to a first lead screw;
    a second pair of blades attached to a second lead screw; and
    the first set of blades positioned at an angle relative to the second pair of blades over the second lens.

5. The system for leveling a semiconductor wafer as defined in claim 1 further comprising:
    a plurality of light sources projecting small diameter beams onto the exposure field;
    a detector corresponding to each of the light sources to detect the location of each small diameter beam on the exposure field; and
    means for adjusting the small diameter beams to match the geometry of the desired exposure field.

6. The system for leveling a semiconductor wafer as defined in claim 5 further comprising:
    a motor attached to each light source and its detector for movement of the respective light source and detector in the X axis; and
    a motor attached to each light source and its detector to move the respective light source and detector in the Y axis.

7. The system of leveling a semiconductor wafer as defined in claim 1, further comprising:
    a step and repeat camera system providing the first lens; and
    the step and repeat camera system providing means for moving the wafer relative to the first lens.

8. A method for leveling a semiconductor wafer relative to the projection lens of a step-and-repeat camera used to fabricate integrated circuits on the semiconductor wafer using projection lithography techniques comprising the steps of:
    projecting a light source onto the desired exposure field on the wafer;
    detecting the reflected light beam from the exposure field and determining the location of the exposure field relative to the projection lens or first lens; and
    adjusting the beam from the light source to match the desired exposure field.

9. The method for leveling a semiconductor wafer as defined in claim 8 further comprising the steps of:
    projecting the light source through a second lens; and
    masking portions of the second lens to produce a beam with dimensions corresponding to the desired exposure field.

10. The method of leveling a semiconductor wafer as defined in claim 9 further comprising the steps of:
    placing a plurality of blades adjacent to the second lens; and
    moving the blades to open and close the second lens.

11. The method of leveling a semiconductor wafer as defined in claim 9 further comprising the steps of:
    attaching a pair of blades to a first lead screw;
    attaching a second pair of blades to a second lead screw;
    placing the first blades at an angle relative to the second pair of blades over the second lens; and
    rotating the lead screws to open and close their respective pair of blades.

12. The method of leveling a semiconductor wafer as defined in claim 8 further comprising the steps of:
    projecting a plurality of small diameter beams onto the exposure field;
    detecting the location of each small diameter light beam on the exposure field; and
    adjusting the location of each small diameter light beam relative to the other small diameter light beams to match the geometry of the desired exposure field.

13. The method of leveling a semiconductor wafer as defined in claim 12 further comprising the steps of:
projecting five small diameter light beams onto the exposure field;
projecting one of the five light beams into the center of the exposure field;
projecting each of the other light beams into one of the respective corners of the exposure field; and
adjusting the position of the light beam in each corner of the exposure field relative to each other.

14. A system for leveling a semiconductor wafer with the projection lens used in a step-and-repeat camera for fabricating integrated circuits on the wafer using projection lithography techniques comprising:
a light source for projecting a beam of light onto the exposure field on the wafer;
a detector to receive the beam from the exposure field and determine the location of the exposure field relative to the projection lens or first lens; and
means for adjusting the light beam to match the desired exposure field.

15. The system for leveling a semiconductor wafer as defined in claim 14 further comprising:
a second lens to direct the light beam from the source to the exposure field; and
means for adjusting the size of the light beam to match the geometry of the desired exposure field.

16. The system for leveling a semiconductor wafer as defined in claim 15 further comprising:
a plurality of movable blades adjacent to the second lens; and
lead screws attached to the blades whereby movement of the lead screws will cause the blades to open or close with respect to the second lens.

17. The system for leveling a semiconductor wafer as defined in claim 15 further comprising:
a pair of blades attached to a first lead screw;
a second pair of blades attached to a second lead screw; and
the first set of blades positioned at an angle relative to the second pair of blades over the second lens.

18. The system for leveling a semiconductor wafer as defined in claim 14 further comprising:
a plurality of light sources projecting small diameter beams onto the exposure field;
a detector corresponding to each of the light sources to detect the location of each small diameter beam on the exposure field; and
means for adjusting the small diameter beams to match the geometry of the desired exposure field.

19. The system for leveling a semiconductor wafer as defined in claim 18 further comprising:
a motor attached to each light source and its detector for movement of the respective light source and detector in the X axis; and
a motor attached to each light source and its detector to move the respective light source and detector in the Y axis.

20. The system for leveling a semiconductor wafer as defined in claim 18 further comprising:
five light sources; and
each light source projecting a small diameter beam of light onto the exposure field.

* * * * *